(12) United States Patent
Pavlicek et al.

(10) Patent No.: US 12,278,163 B2
(45) Date of Patent: Apr. 15, 2025

(54) POWER SEMICONDUCTOR MODULE WITH INJECTION-MOLDED OR LAMINATED COOLER ASSEMBLY

(71) Applicant: Hitachi Energy Ltd, Zürich (CH)

(72) Inventors: Niko Pavlicek, Zürich (CH); Lluis Santolaria, Olten (CH); Dominik Truessel, Bremgarten (CH); Helder Mata, Baden (CH)

(73) Assignee: Hitachi Energy Ltd, Zürich (CH)

( * ) Notice: Subject to any disclaimer, the term of this patent is extended or adjusted under 35 U.S.C. 154(b) by 263 days.

(21) Appl. No.: 17/681,136

(22) Filed: Feb. 25, 2022

(65) Prior Publication Data

US 2022/0301979 A1     Sep. 22, 2022

(30) Foreign Application Priority Data

Mar. 19, 2021   (EP) .................................. 21163707

(51) Int. Cl.
| | |
|---|---|
| *H01L 23/46* | (2006.01) |
| *H01L 21/48* | (2006.01) |
| *H01L 21/56* | (2006.01) |
| *H01L 23/31* | (2006.01) |
| *H01L 23/473* | (2006.01) |
| *H05K 7/20* | (2006.01) |

(52) U.S. Cl.
CPC ........ *H01L 23/473* (2013.01); *H01L 21/4817* (2013.01); *H01L 21/4882* (2013.01); *H01L 21/565* (2013.01); *H01L 23/3142* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 5,658,408 | A * | 8/1997 | Frantz ................... | B29C 66/41 |
| | | | | 156/359 |
| 5,966,291 | A * | 10/1999 | Baumel .............. | H05K 7/20927 |
| | | | | 165/80.4 |
| 8,963,321 | B2 * | 2/2015 | Lenniger ................. | H01L 24/48 |
| | | | | 257/E23.101 |
| 9,386,685 | B2 * | 7/2016 | Bonkohara .......... | H05K 7/2039 |
| 9,472,488 | B2 * | 10/2016 | Gohara ..................... | F28F 3/00 |
| 9,613,885 | B2 | 4/2017 | Yoo et al. | |

(Continued)

FOREIGN PATENT DOCUMENTS

| | | |
|---|---|---|
| CN | 201674745 U | 12/2010 |
| CN | 202058722 U | 11/2011 |

(Continued)

*Primary Examiner* — Courtney L Smith
(74) *Attorney, Agent, or Firm* — Slater Matsil, LLP (57) ABSTRACT

A cooling assembly includes a first cooler part having an opening and an attachment point arranged on a first side of the first cooler part. The opening is configured to receive an integrated cooling structure of a corresponding semiconductor module that includes a baseplate to be attached to the attachment point on the first side of the first cooler part. A second cooler part is arranged on an opposite, second side of the first cooler part. The first cooler part and the second cooler part are made from a fiber reinforced polymer material and are joined so as to form a cavity for a coolant between the second side of the first cooler part and the second cooler part.

20 Claims, 4 Drawing Sheets

(56) References Cited

U.S. PATENT DOCUMENTS

| | | | |
|---|---|---|---|
| 11,039,068 B2* | 6/2021 | Kimura | H04N 23/63 |
| 11,239,123 B2* | 2/2022 | Kawase | H01L 23/49838 |
| 11,348,850 B2* | 5/2022 | Takabayashi | H01L 23/367 |
| 2003/0053298 A1* | 3/2003 | Yamada | H05K 7/20927 |
| | | | 361/728 |
| 2004/0041429 A1* | 3/2004 | McLaren | B62D 29/002 |
| | | | 296/57.1 |
| 2005/0143000 A1 | 6/2005 | Eisele et al. | |
| 2008/0237847 A1* | 10/2008 | Nakanishi | F28F 3/12 |
| | | | 257/722 |
| 2010/0232112 A1 | 9/2010 | Jechi et al. | |
| 2011/0316143 A1 | 12/2011 | Noritake et al. | |
| 2015/0102480 A1* | 4/2015 | Nakagawa | H01L 23/3672 |
| | | | 257/714 |
| 2017/0278770 A1* | 9/2017 | Kato | H01L 23/4006 |
| 2019/0341335 A1* | 11/2019 | Koyama | F28D 1/03 |
| 2019/0357386 A1 | 11/2019 | Coppola et al. | |
| 2021/0176896 A1* | 6/2021 | Yang | H05K 7/20254 |

FOREIGN PATENT DOCUMENTS

| | | | |
|---|---|---|---|
| CN | 206040628 U | 3/2017 | |
| CN | 106659071 A | 5/2017 | |
| DE | 3937130 A1 | 5/1990 | |
| DE | 102007025958 A1 | 12/2008 | |
| DE | 102019111533 A1 | 11/2019 | |
| DE | 102019008611 A1 | 10/2020 | |
| EP | 0841843 A1 | 5/1998 | |
| EP | 1331665 A1 | 7/2003 | |
| EP | 1843392 A1 | 10/2007 | |
| EP | 2524945 A1 | 11/2012 | |
| JP | 2004103936 A * | 4/2004 | ... H01L 2224/48227 |
| JP | 2008218940 A | 9/2008 | |
| JP | 2014229649 A | 12/2014 | |
| JP | 2014239176 A | 12/2014 | |
| WO | 2015140944 A1 | 9/2015 | |
| WO | 2016047454 A1 | 3/2016 | |

* cited by examiner

POWER SEMICONDUCTOR MODULE WITH INJECTION-MOLDED OR LAMINATED COOLER ASSEMBLY

CROSS-REFERENCE TO RELATED APPLICATIONS

This application claims the benefit of European Patent Application No. 21163707.9, filed on Mar. 19, 2021, which application is hereby incorporated herein by reference.

TECHNICAL FIELD

The disclosure describes a power semiconductor module with an injection-molded or a laminated cooler assembly.

BACKGROUND

U.S. Pat. No. 9,613,885 B2 relates to a cooling apparatus including a plurality of discrete modules and a plastic housing. Each module includes a semiconductor die encapsulated by a mold compound, a plurality of leads electrically connected to the semiconductor die and protruding out of the mold compound, and a first cooling plate at least partly uncovered by the mold compound. The plastic housing surrounds the periphery of each module to form a multi-die module.

U.S. Patent Publication 2011/0316143 A1 relates to a semiconductor module which includes a semiconductor unit which is made by a resin mold. The resin mold has formed therein a coolant path through which a coolant flows to cool the semiconductor chip embedded in the resin mold.

SUMMARY

Embodiments related to a cooling assembly for at least one semiconductor module, a power module and a method for manufacturing a power module. For example, the present disclosure relates to a cooling assembly for at least one semiconductor module having a baseplate with an integrated cooling structure. The present disclosure further relates to a power module comprising such a cooling assembly and at least one semiconductor module as well as a method for manufacturing a power module.

Embodiments can provide improved cooling assemblies for semiconductor modules, which are easy to manufacture and assemble, are lightweight, and allow efficient cooling of power semiconductor dies.

One embodiment provides a cooling assembly for at least one semiconductor module having a baseplate with an integrated cooling structure. The cooling assembly comprises a first cooler part and a second cooler part. The first cooler part has at least one opening and at least one attachment point arranged on a first side of the first cooler part The at least one opening is configured to receive an integrated cooling structure of a corresponding semiconductor module, whose baseplate is attached to the at least one attachment point on a first side of the first cooler part. A second cooler part is arranged on an opposite, second side of the first cooler part. The first cooler part and the second cooler part are made from a fiber reinforced polymer material and are joined in a sealing manner so as to form a cavity for a coolant between the second side of the first cooler part and the second cooler part.

Other embodiments and variations are disclosed herein.

BRIEF DESCRIPTION OF THE DRAWINGS

The accompanying figures are included to provide a further understanding. In the figures, elements of the same structure and/or functionality may be referenced by the same reference signs. It is to be understood that the embodiments shown in the figures are illustrative representations and are not necessarily drawn to scale.

DETAILED DESCRIPTION OF ILLUSTRATIVE EMBODIMENTS

While the invention is amenable to various modifications and alternative forms, specifics thereof have been shown by way of example in the figures and will be described in detail. It should be understood, however, that the intention is not to limit the invention to the particular embodiments described. On the contrary, the intention is to cover all modifications, equivalents, and alternatives falling within the scope of the invention defined by the appended claims.

According to a first aspect of the disclosure, a cooling assembly for at least one semiconductor module having a baseplate with an integrated cooling structure is provided. The cooling assembly comprises a first cooler part having at least one opening and at least one attachment point arranged on the first side of the first cooler part, wherein the at least one opening is configured to receive an integrated cooling structure of a corresponding semiconductor module, whose baseplate is attached to the at least one attachment point on the first side of the first cooler part, and a second cooler part arranged on an opposite, second side of the first cooler part. The first and the second cooler parts are made from a fiber reinforced polymer material and are joined in a sealing manner so as to form a cavity for a coolant between the second side of the first cooler part and the second cooler part.

The above cooling assembly can be easily formed, for example by conventional injection molding processes, from lightweight polymer-based materials. The use of fiber reinforced polymer materials is compatible with coolants used in high power applications, such as automotive power electronics. At the same time, the integrated opening and at least one attachment point facilitate an easy assembly of the module. For example, only the first cooler part, only the second cooler part, or both the first cooler part and the second cooler part could be an injection-molded plastic part.

According to at least one embodiment, at least one of the first cooler part or the second cooler part comprises at least one of polyphenylene sulfide (PPS), polycarbonate (PC) and acrylonitrile butadiene styrene (ABS), reinforced by glass fibers. For example, only the first cooler part, only the second cooler part, or both the first cooler part and the second cooler part could comprise one or more of the above materials, which are flame-resistant, can tolerate temperatures of up to 200° C. and 140° C., respectively, and are compatible with typical coolants such as ethylene glycol.

According to at least one embodiment, at least one of the first cooler part or the second cooler part is a laminated carbon composite part. For example, only the first cooler part, only the second cooler part, or both the first cooler part and the second cooler part could comprise pre-impregnated composite fibers. Such materials are strong and lightweight and can be manufactured using novel processing techniques such as out-of-autoclave composite manufacturing.

According to at least one embodiment, the first cooler part and the second cooler part are joined by a plastic welding joint or an adhesive bonding joint. Alternatively, a heat bonding may also be used. Such joints are easy to manufacture and prevent leakage of the coolant from the cooling assembly. At the same time, manufacturing the cooling assembly from two different cooler parts allows for the provision of relatively complicated housing structures.

According to at least one embodiment, the at least one attachment point comprises at least one threaded inlay for attaching a screw. Embedding a threaded inlay into the first cooler part, for example using metal insert molding, enables manufacturing cooling assemblies that are largely compatible with conventional cooling assemblies made from metal materials.

According to at least one embodiment, the at least one attachment point comprises an interlocking structure configured for receiving an adhesive bond line. Use of an interlocking structure in combination with an adhesive bond line allows to compensate for lateral and vertical misalignments between the first cooler part and the at least one semiconductor module. At the same time, a sealed connection between the first cooler part of the cooling assembly and the semiconductor module attached thereto can be formed, eliminating the need for a separate gasket between the two parts.

According to at least one embodiment, the cooling assembly further comprises a groove arranged in one of the first side of the first cooler part and the baseplate, the groove surrounding the at least one opening and the integrated cooling structure, respectively, and a gasket arranged in the groove for forming a seal between the first cooler part and the baseplate attached to the cooling assembly by means of the at least one attachment point. This enables the use of conventional O-ring gaskets or novel form-in-place (FIP) gaskets, for example when attaching conventional semiconductor modules to the disclosed cooling assembly.

According to a second aspect of the disclosure, a power module comprises a cooling assembly pursuant to the first aspect and at least one semiconductor module having a baseplate with an integrated cooling structure, wherein the baseplate is attached to the cooling assembly at the at least one attachment point, such that the integrated cooling structure protrudes through the at least one opening into the cavity. Such a power module is lightweight and easy to manufacture.

According to a third aspect, a method for manufacturing a power module is disclosed. The method comprises the steps of: forming a first cooler part from a fiber reinforced polymer material, the first cooler part having at least one opening and at least one attachment point arranged on a first side of the first cooler part; forming a second cooler part from a fiber reinforced polymer material; joining the first and the second cooler parts by a plastic welding or adhesive bonding process to form a cavity for a coolant between an opposite, second side of the first cooler part and the second cooler part; and attaching at least one semiconductor module having a baseplate with an integrated cooling structure to the first side of the first cooler part using the at least one attachment point, so that the integrated cooling structure protrudes through the at least one opening into the cavity of the cooling assembly.

The above steps enable the manufacturing of a lightweight power module using a molding process.

To aid understanding of the present disclosure, at first a conventional power module 1 having an aluminum alloy cooler assembly is described with reference to FIGS. 1 and 2.

Figure 1:
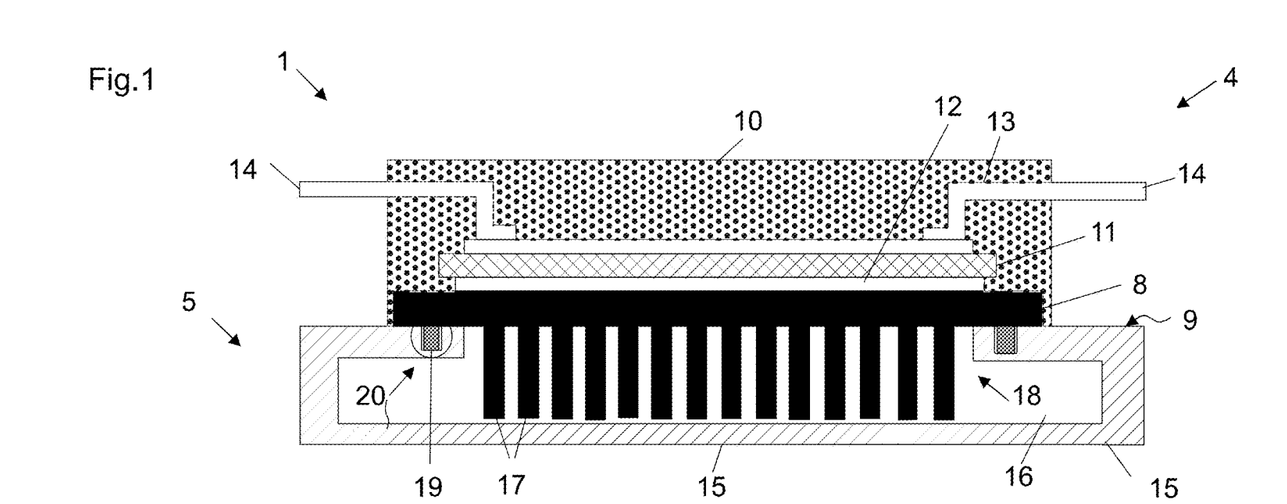
FIG. 1 shows schematically a first cross-section through a conventional power module.

FIG. 1 shows, in a schematic manner, a first cross-section of the power module 1, wherein the coolant flows into or out of the plane shown in FIG. 1. FIG. 2 shows a second, perpendicular cross-section through the same power module 1, wherein the coolant flows from a first port 2 shown on the left-hand side to the second port 3 shown on the right-hand side of FIG. 2.

The power module 1 comprises two semiconductor modules 4 attached to a cooling assembly 5. As can be seen in FIG. 2, the semiconductor modules 4 are attached to the cooling assembly 5 by means of clamps 6 and corresponding screws 7 clamping a baseplate 8 of each semiconductor module 4 to a top surface 9 of the cooling assembly 5.

The baseplate 8 is made from a metal material and embedded into a mold body 10. The mold body 10 also embeds a substrate 11, on which the actual semiconductor dies 12 forming the power component of the power module 1 are formed. Several conductive leads 13 are attached to the backside of the substrate 11. The leads 13 extend to terminals 14 outside the mold body 10.

The cooling assembly 5 is made from a hollow aluminum alloy body part 15 which is used to guide a coolant 16, such as an ethylene glycol-water mixture from the first port 2 to the second port 3 or vice versa. On its way from the first port 2 to the second poll 3, the liquid coolant 16 passes through an array of pin fins 17. The pin fins 17 extend from the baseplate 8 and protrude through corresponding openings 18 in the aluminum alloy body part 15 into the flow of the coolant 16, and therefore significantly increase a surface area of the baseplates 8 exposed to the coolant 16. In operation, heat dissipated by the semiconductor dies 12 is conducted via the baseplates 8 and the arrays of pin fins 17 to the coolant 16, thus significantly improving a heat or thermal transfer coefficient of the cooling arrangement. This in turn improves a thermal flow away from the semiconductor dies 12 as compared to semiconductor power modules without integrated cooling structure.

In an automotive application, the first and second polls 2 and 3 of the cooling assembly 5 can be connected to a general cooling system of a vehicle. To maintain a liquid-tight seal between the semiconductor modules 4 and the cooling assembly 5, in the depicted cooling arrangement, O-Ring gaskets 19 are placed in respective grooves 20 surrounding the openings 18 of the cooling assembly 5.

The above power module 1 and cooling assembly 5 work reliably in different application scenarios. However, forming of the cooling assembly 5 from a metal material, such as an aluminum alloy, adds weight to the overall power module 1. Moreover, the assembly of such a multi-part, partly metal power module 1 results in relatively high production costs and a high part count. Thus, there is a need to further decrease the weight and component count of such power modules.

Figure 2:
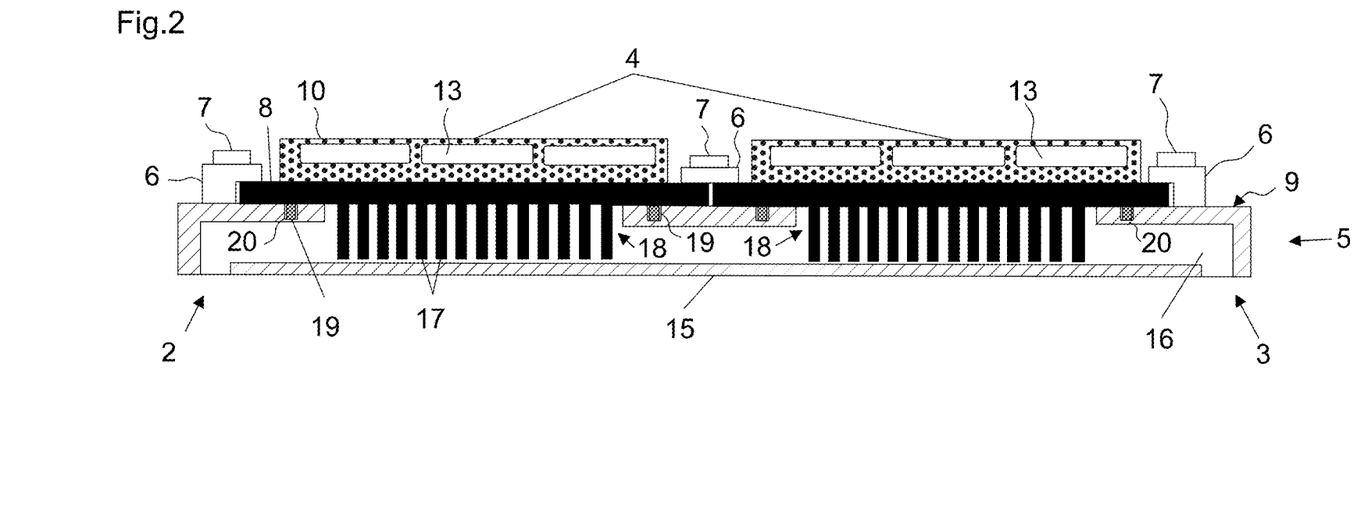
FIG. 2 shows schematically a second cross-section through the power module of FIG. 1.
Figure 3:
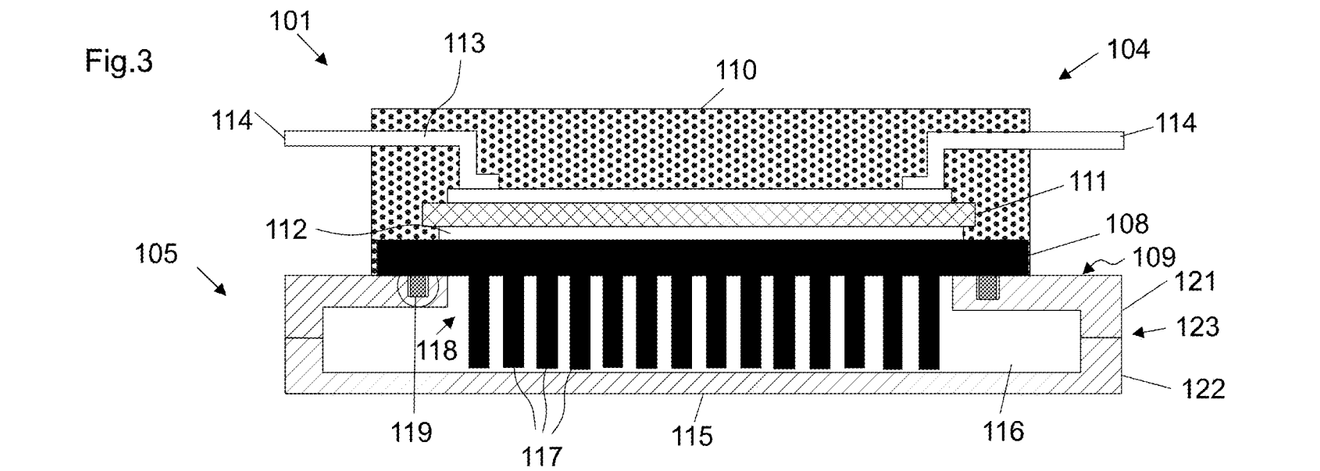
FIG. 3 shows schematically a first cross-section through a power module according to an embodiment of the present disclosure.
Figure 4:
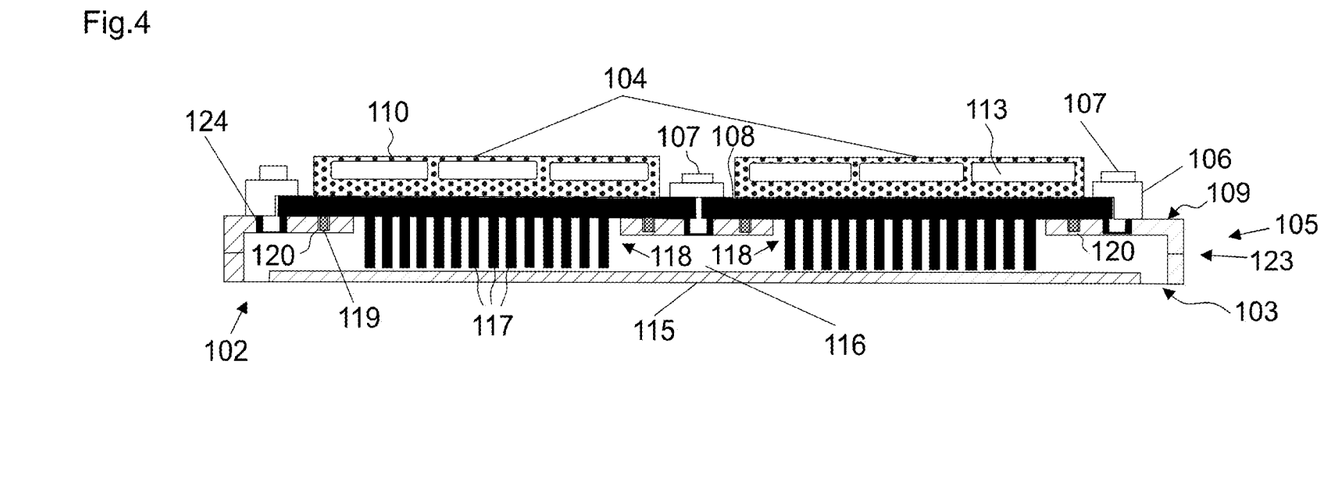
FIG. 4 shows schematically a second cross-section through the power module of FIG. 3.

FIGS. 3 and 4 show, in a schematic manner, cross-sections through a power module 101 according to a first embodiment of the present disclosure. The cross-section shown in FIGS. 3 and 4 correspond to the cross-section of the power module 1 shown in FIGS. 1 and 2, respectively. For ease of explanation, corresponding reference signs are used to explain the embodiment shown in FIGS. 3 and 4.

The power module 101 according to the described disclosure comprises two semiconductor modules 104 and a common cooling assembly 105. Of course, power modules comprising further semiconductor modules 104 or only a single semiconductor module 104 are also possible. The power module 101 may be part of a liquid cooled inverter, for example.

The semiconductor modules 104 are attached to a top surface 109 of the cooling assembly 105 by means of clamps 106 and screws 107 as detailed above. In another embodiment, each semiconductor module 104 is attached to a top surface 109 of the cooling assembly 105 by means of screws 107 only (not shown). For example, screws 107 may be passed through corresponding holes or slits of each semiconductor module 104. Alternatively, screws 107 having a sufficiently large head can be used to eliminate the need for separate clamping parts.

Each semiconductor module 104 comprises a housing no, for example a mold body or other type of plastic housing, such as an injection molded housing and/or a housing filled with insulating material such as a gel. A substrate 111 carrying one or several semiconductor dies 112 is embedded into the housing 110. For example, the semiconductor dies 112 may be IGBTs, diodes, or MOSFETs of a power switching stage of an inverter. The semiconductor dies 112 and/or the substrate 111 can be contacted from terminals 114 by means of leads 113. The housing no also partly encloses a metal baseplate 108 in thermal connection with the semiconductor dies 112. The metal baseplate 108 has an integrated cooling structure in the form of several pin fins 117 extending from the baseplate 108 on the opposite side of the semiconductor dies 112.

Contrary to the cooling assembly 5 shown in FIGS. 1 and 2, the cooling assembly 105 shown in FIGS. 3 and 4 is made from a fiber reinforced polymer material. For example, glass-fiber reinforced polymers or carbon-fiber reinforced polymers may be used. To form the cooling assembly 105, two separate cooler parts, a first cooler part 121 and a second cooler part 122 are joined by a watertight joint 123. In the described embodiment, the first cooler part 121 and the second cooler part 122 are formed by molding and contain a cavity through which a coolant 116 can flow from a first port 102 to a second port 103 or vice versa. Together, the first cooler part 121 and the second cooler part 122 form a plastic body part 115.

Glass-fiber reinforced polymers can be manufactured by standard injection molding processes. The fibers are typically short and not oriented in a particular direction. Many different materials are commercially available, for example Solvay Ryton or Covestro Bayblend. Such a cooling assembly 105 and corresponding power module 101 have several advantageous properties. For example, the use of reinforced polymer material results in a relatively low weight and cost of the cooling assembly 105. At the same time, many thermoplastic polymer materials, for example Solvay Ryton comprising PPS or Covestro Bayblend comprising a blend of PC and ABS, pass UL94 V-0 flammability requirements and are heat-resistant up to 200° C. and 140° C., respectively, as required, for example, in the field of automotive power modules. Moreover, Ryton is also specifically stated to be compatible with ethylene glycol, an anti-freeze component used in cooling systems of various water-based coolers. Moreover, polymer injection molding techniques are more flexible than conventional metal machining or die-casting techniques, thus allowing for the production of a more complex design of the plastic body part 115.

Alternatively, instead of using injection molded plastic parts, it is also possible to form the first cooler part 121 and/or second cooler part 122 from pre-impregnated composite fibers, for example carbon fibers. Carbon-fiber reinforced polymers are typically more expensive to manufacture and known from aerospace, or sports equipment, where high strength-to-weight ratios are essential. Their fibers are long, woven, and/or oriented in a particular direction. The fibers are made from synthetic polymers, as for example polyacrylonitrile or rayon. For certain applications, sheets with epoxy pre-impregnated into the fibers, also referred to as "pre-pregs" Such high-performance parts can be manufactured in autoclaves with heated pressure chambers. More recently, molding without use of an autoclave can be used to manufacture parts from layered sheets of carbon fiber, referred to "out-off-autoclave" manufacturing. Out-of-autoclave composite manufacturing based on resin transfer molding or balanced pressure fluid molding enables their mass production at relatively low cost.

The watertight joint 123 between the two cooler parts 121 and 122 can be formed, for example, using ultrasonic or laser-based plastic welding or an appropriate adhesive bond and alleviates the need for a separate seal between the two cooler parts. It also reduces a leakage risk due to seal failure after ageing due to the temperature and chemical composition of the coolant 116.

As before, the array of pin fins 117 formed on the lower surface of the baseplate 108 protrude through an opening 118 of the cooling assembly 105. In the described embodiment, two openings 118 corresponding to the two semiconductor power modules 104 are formed in the first cooler part 121.

Unlike in the embodiment shown in FIGS. 1 and 2, the attachment and sealing of the semiconductor modules 104 to the top surface 109 of the cooling assembly 105 is implemented in a different manner. Threaded metal inlays 124 are embedded into the reinforced polymer material, which allows clamping of the semiconductor modules 104 to the first cooler part 121 using the screws 107 and clamps 106. This can be achieved, for example, by putting the inlays 124 into a form used for molding the first cooler part 121, also referred to as metal insert molding.

In addition, a so-called form-in-place (FIP) gasket 119 is formed directly within a groove 120 surrounding the openings 118 of the first cooler part 121. Accordingly, no separate part, such as an O-ring or other customized form of gasket is required for the embodiment shown in FIGS. 3 and 4. Dispensing of a FIP gasket 119 between the plastic cooler part 121 and the metal baseplate 108 alleviates the need to provide a separate O-ring gasket. Nonetheless, in another embodiment, a conventional O-ring gasket 19 or other replaceable gasket having a customized shape can also be used in the assembly shown in FIGS. 3 and 4.

Figure 5:
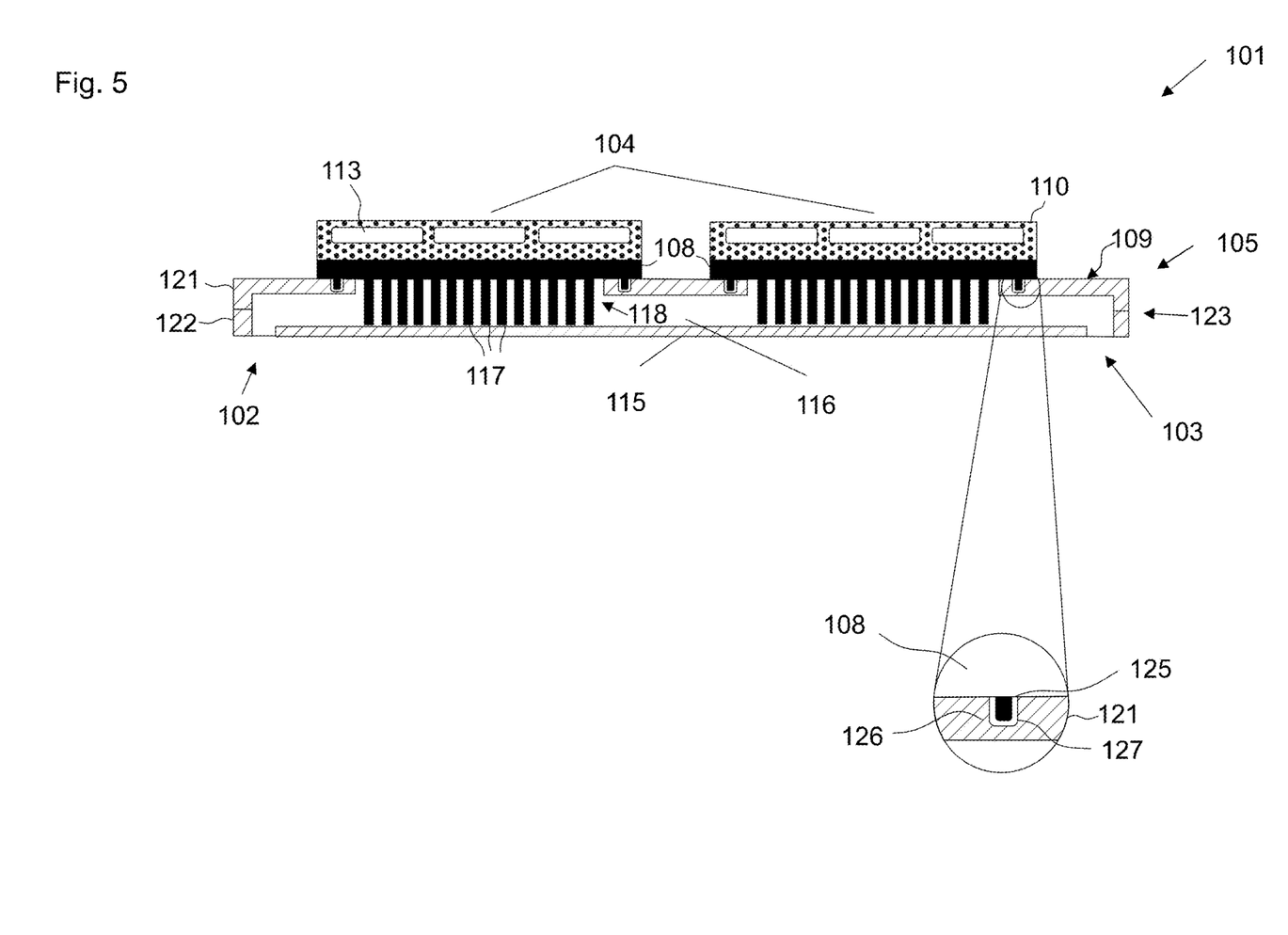
FIG. 5 shows schematically a cross-section through a power module according to another embodiment of the present disclosure.

FIG. 5 shows, in a schematic manner, a cross-section through a power module 101 according to a second embodiment of the disclosure. Again, corresponding reference signs will be used with regard to the second embodiment shown in FIG. 5. Accordingly, the description of corresponding parts will not be repeated here for the sake of conciseness.

As can be seen from the cross-section shown in FIG. 5 with respect to the cross-section of the first embodiment shown in FIG. 4, the attachment of the individual semiconductor modules 104 to the top surface 109 of the cooling assembly 105 has been further simplified. Instead of using separate clamps 106 and/or screws 107 attached to inlays 124, the baseplate 108 and the first cooler part 121 provide interlocking projections 125 and grooves 126 respectively. To mechanically join and seal the semiconductor modules 104 to the first cooler part 121, an adhesive and optionally sealing bond line 127 is formed in the groove 126 of the first cooler part 121. In an alternative embodiment not shown in the figures, a groove 126 is formed be in the base plate 108 and the interlocking projections 125 are formed on the first cooler part 121 of the cooler.

Attention is drawn to the fact that many other interlocking features can be used to form the connection between the semiconductor module 104 and the cooling assembly 105. The shape and relative arrangement of the disclosed interlocking features is not intended to limit the scope of protection.

In the exemplary embodiment, the adhesive bond between the semiconductor module 104 and the cooling assembly 105 is based on a silicone adhesive. The surface energy on the areas to be bonded is greater than 45 mN/m. Their surface roughness, Ra, may be between 4 µm to 6 µm.

The embodiment shown in FIG. 5 has the additional advantage that the bond line 127 can be easily applied during manufacturing of the first cooler part 121. Moreover, as shown in the enlarged part of FIG. 5, the bond line 127 has the capability of absorbing surface geometrical variations of the baseplate 108 and/or the first cooler part 121 without creating residual stress on these parts. Lastly, the bond line 127 can also absorb thermal expansions for different materials without compromising the structural connection or water-tightness of the joint.

Although not shown in the figures, an alignment feature for aligning each semiconductor module 104 with respect to the first cooler part 121 of the cooler in a lateral direction can be used. This will improve lateral bond line thickness control in the groove 126. In addition or as alternative, spacers outside the groove 126 can be used to control the vertical thickness of the bond line 127.

Figure 6:
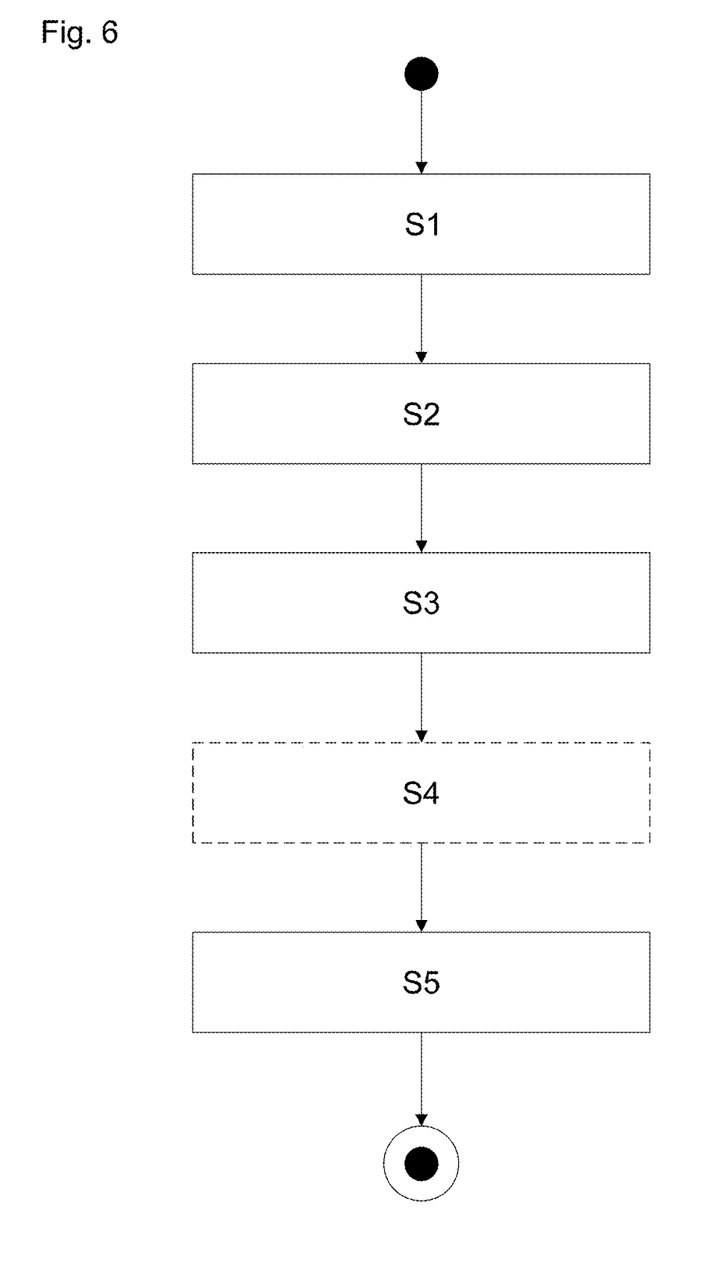
FIG. 6 shows schematically a method for manufacturing a power module.

FIG. 6 shows, in a schematic way, a method for manufacturing a power module 101 using steps S1 to S5. Attention is drawn to the fact that steps S1 to S5 may be performed in a different order and/or in parallel. For example, the second cooler part 122 may be formed before the first cooler part 121. Also, the semiconductor module 104 may be attached to the first cooler part 121 before this is joined to the second cooler part 122.

In step S1, a first cooler part 121 is formed from a fiber reinforced polymer material, the first cooler part 121 having at least one opening 118 and at least one attachment point arranged on a first side of the first cooler part 121. For example, as described above, injection molding may be used to form a glass fiber reinforced polymer part, or resin transfer molding or balanced pressure fluid molding may be used to form a carbon fiber reinforced composite part. Before the plastic material is put into the mold form, additional components, such as threaded metal inlays 124, may be placed in the mold form and are then embedded in the finished plastic part accordingly. The mold form can be designed to produce any desired grooves 120 or 126 and/or projections 125 to accommodate a gaskets or an adhesive and optionally sealing bond line 127. Moreover, a lamination process may also be used to form the first cooler part 121.

In step S2, a second cooler part 122 is formed from a fiber reinforced polymer material. Similar materials and methods as described above with respect to step S1 can be employed.

In step S3, the first cooler part 121 and the second cooler part 122 are joined by a plastic welding or adhesive bonding process to form a cavity for a coolant 116 between the first cooler part 121 and the second cooler part 122. For example, as explained above, laser or ultrasonic welding may be employed to form a watertight weld seam.

In optional step S4, a gasket may be attached to the first cooler part 121. For example, a conventional O-ring gasket 19 or a FIP gasket 119 may be placed in a groove 120 on the surface of the first cooler part 121.

In step S5, at least one semiconductor module 104 having a baseplate 108 with an integrated cooling structure is attached to the first side of the first cooler part 121 using the at least one attachment point. As a result the integrated cooling structure protrudes through the at least one opening 118 into the cavity of the cooling assembly 105. As detailed above, this may comprise clamping the semiconductor module 104 to the top surface 109 of the first cooler part 121 using screws 107. Alternatively, a first interlocking structure of the baseplate 108 of the semiconductor module 104 may be glued to a corresponding second interlocking structure of the first cooler part 121 using an adhesive and optionally sealing bond line 127.

The embodiments shown in FIGS. 1 to 6 as stated represent exemplary embodiments of improved cooling assemblies 105 and power modules 101 and also detail the steps necessary for their manufacturing. They do not constitute a complete list of all embodiments according to the disclosure. Actual cooling assemblies and power modules and methods for their manufacturing may vary from the embodiments shown in terms of the above-mentioned embodiments.

As detailed above, the present disclosure comprises several aspects and embodiments thereof. Every feature described with respect to one of the aspects and its embodiments is also disclosed herein with respect to the other aspects, even if the respective feature is not explicitly mentioned in the context of the specific aspect. Moreover, for embodiments disclosed as comprising at least one of a first feature A or a second feature B, it is disclosed that a first embodiment may comprise only the first feature A, a separate second embodiment may comprise only the second feature B, and a separate third embodiment may comprise the first feature A and the second feature B.

What is claimed is:

1. A cooling assembly comprising:
a first cooler part having an opening and an attachment point arranged on a first side of the first cooler part, wherein the opening is configured to receive an integrated cooling structure of a corresponding semiconductor module that includes a metal baseplate to be attached to the attachment point on the first side of the first cooler part, the first cooler part and the metal baseplate being attached without an O-ring; and
a second cooler part arranged on an opposite, second side of the first cooler part, wherein the first cooler part and the second cooler part are made from a fiber reinforced polymer material and are joined to form a cavity for a coolant between the second side of the first cooler part and the second cooler part.

2. The cooling assembly of claim 1, wherein the first cooler part or the second cooler part is an injection-molded plastic part.

3. The cooling assembly of claim 1, wherein the first cooler part or the second cooler part comprises polyphenylene sulfide, polycarbonate, or acrylonitrile butadiene styrene reinforced by glass fibers.

4. The cooling assembly of claim 1, wherein the first cooler part or the second cooler part is a laminated carbon composite part.

5. The cooling assembly of claim 1, wherein the first cooler part or the second cooler part comprises pre-impregnated composite fibers.

6. The cooling assembly of claim 1, wherein the first cooler part and the second cooler part are joined by a plastic welding joint.

7. The cooling assembly of claim 1, wherein the first cooler part and the second cooler part are joined by an adhesive bonding joint.

8. The cooling assembly of claim 1, wherein the attachment point comprises a threaded inlay for attaching a screw.

9. The cooling assembly of claim 1, wherein the attachment point comprises an interlocking structure configured for receiving an adhesive bond line.

10. The cooling assembly of claim 1, further comprising:
a groove arranged in the first side of the first cooler part or the baseplate, the groove surrounding the opening and the integrated cooling structure, respectively; and
a gasket arranged in the groove and forming a seal between the first cooler part and the baseplate attached to the cooling assembly.

11. The cooling assembly of claim 10, wherein the gasket comprises a form-in-place gasket or a replaceable gasket.

12. A power module, comprising:
a cooling assembly comprising a first cooler part having an opening and an attachment point arranged on a first side of the first cooler part and a second cooler part arranged on an opposite, second side of the first cooler part, wherein the first cooler part and the second cooler part are made from a fiber reinforced polymer material and are joined in a sealing manner so as to form a cavity for a coolant between the second side of the first cooler part and the second cooler part; and
a semiconductor module having a metal baseplate with an integrated cooling structure, wherein the integrated cooling structure protrudes through the opening into the cavity and the baseplate is attached to the first side of the first cooler part of the cooling assembly at the attachment point without an O-ring.

13. The power module of claim 12, wherein the semiconductor module comprises a power semiconductor die encapsulated by a housing and a plurality of leads electrically connected to the power semiconductor die and protruding out of the housing.

14. A method for manufacturing a power module, the method comprising:
providing a first cooler part from a fiber reinforced polymer material, the first cooler part having an opening and an attachment point arranged on a first side of the first cooler part;
providing a second cooler part from a fiber reinforced polymer material;
joining the first cooler part and the second cooler part by a plastic welding or adhesive bonding process to form a cavity for a coolant between an opposite, second side of the first cooler part and the second cooler part; and
attaching a semiconductor module having a metal baseplate with an integrated cooling structure to the first side of the first cooler part using the attachment point, wherein the semiconductor module is attached to the first side of the first cooler part without an O-ring and wherein the integrated cooling structure protrudes through the opening into the cavity.

15. The method of claim 14, wherein joining the first cooler part and the second cooler part comprises joining the first cooler part and the second cooler part by the plastic welding.

16. The method of claim 14, wherein joining the first cooler part and the second cooler part comprises joining the first cooler part and the second cooler part by the adhesive bonding process.

17. The method of claim 14, wherein providing the first cooler part comprises forming the first cooler part by molding or laminating the first cooler part using the fiber reinforced polymer material.

18. The method of claim 14, wherein providing the second cooler part comprises forming the second cooler part by molding or laminating the second cooler part using the fiber reinforced polymer material.

19. The method of claim 14, wherein the first cooler part comprises at least one threaded metal insert and wherein attaching the semiconductor module comprises clamping the semiconductor module to the first cooler part using a screw screwed into the threaded metal insert.

20. The method of claim 14, wherein the first cooler part comprises a first interlocking structure on the first side and wherein attaching the semiconductor module comprises placing a bond line between the first interlocking structure and a corresponding second interlocking structure of the semiconductor module, so as to form an adhesive bond between the first cooler part and the semiconductor module.

* * * * *